(12) United States Patent
Wang

(10) Patent No.: US 11,948,649 B2
(45) Date of Patent: Apr. 2, 2024

(54) ANTI-FUSE MEMORY CELL AND DATA READ-WRITE CIRCUIT THEREOF

(71) Applicant: NANJING QINHENG MICROELECTRONICS CO., LTD., Nanjing (CN)

(72) Inventor: Chunhua Wang, Nanjing (CN)

(73) Assignee: NANJING QINHENG MICROELECTRONICS CO., LTD., Nanjing (CN)

( * ) Notice: Subject to any disclaimer, the term of this patent is extended or adjusted under 35 U.S.C. 154(b) by 0 days.

(21) Appl. No.: 18/253,870

(22) PCT Filed: Oct. 15, 2021

(86) PCT No.: PCT/CN2021/124181
§ 371 (c)(1),
(2) Date: May 22, 2023

(87) PCT Pub. No.: WO2023/010687
PCT Pub. Date: Feb. 9, 2023

(65) Prior Publication Data
US 2024/0006005 A1    Jan. 4, 2024

(30) Foreign Application Priority Data
Aug. 4, 2021 (CN) .......................... 202110889462.3

(51) Int. Cl.
G11C 7/00    (2006.01)
G11C 7/10    (2006.01)
G11C 17/16   (2006.01)

(52) U.S. Cl.
CPC ............ G11C 17/16 (2013.01); G11C 7/1069 (2013.01); G11C 7/1096 (2013.01)

(58) Field of Classification Search
CPC ...................................................... G11C 17/16
USPC ....................................................... 365/225.7
See application file for complete search history.

(56) References Cited

U.S. PATENT DOCUMENTS

| | | | |
|---|---|---|---|
| 2011/0075500 A1* | 3/2011 | Kodama | G11C 17/16 365/225.7 |
| 2017/0125121 A1 | 5/2017 | Chen et al. | |
| 2017/0372790 A1 | 12/2017 | Jeong et al. | |

FOREIGN PATENT DOCUMENTS

CN           105849861 A    8/2016

* cited by examiner

Primary Examiner — Hoai V Ho
(74) Attorney, Agent, or Firm — CBM PATENT CONSULTING, LLC

(57) ABSTRACT

An anti-fuse memory cell and a data read-write circuit thereof. The anti-fuse memory cell comprises a base, the base is provided with an N-well and a non-N-well region; the non-N-well region is provided with a first NMOS transistor; a gate of the first NMOS transistor is used for inputting a first selection signal; the N-well is provided with a PMOS transistor and a varactor; a gate of the PMOS transistor and a gate of the varactor are both connected to a drain of the first NMOS transistor; and a drain, a source and a substrate of the PMOS transistor and a drain, a source, and a substrate of the varactor are all connected to a controllable power supply.

8 Claims, 10 Drawing Sheets

ANTI-FUSE MEMORY CELL AND DATA READ-WRITE CIRCUIT THEREOF

TECHNICAL FIELD

The present invention belongs to the field of integrated circuit design, and particularly relates to an anti-fuse memory cell and a data read-write circuit thereof.

BACKGROUND

The development of semiconductor technologies brings opportunities for product intelligence. Electronic intelligence usually requires a MCU, and a necessary part of the MCU is memory. An OTP (One-Time Programmable) memory is widely used due to the advantages of high density, few MASK layers and low cost thereof. At present, there are numerous OTP memories in the market, and they are constantly being updated. An early floating-gate OTP cannot be reliably used for a thin gate oxide layer of 65 nm or in a more advanced technology, so an anti-fuse solution is generally adopted in the advanced technology. Because one memory needs thousands of OTP memory cells to be arranged in an array, a structure and an arrangement density of the memory cells directly determine an area of the memory, thus affecting the cost thereof. In addition, reliability and a reading speed, that is, a running speed of the MCU, are also the main indicators of the memory.

SUMMARY

Object of the present invention: in order to solve the problems of large area, high on-resistance and low reading speed and reliability of an anti-fuse memory in the prior art, the present invention provides an anti-fuse memory unit and a data read-write circuit thereof.

Another object of the present invention is to provide an anti-fuse memory.

Technical solutions: an anti-fuse memory cell comprises a base, wherein the base is provided with an N-well and a non-N-well region; the non-N-well region is provided with a first NMOS transistor; a gate of the first NMOS transistor is used for inputting a first selection signal; the N-well is provided with a PMOS transistor and a varactor; the gate of the PMOS transistor and a gate of the varactor are both connected to a drain of the first NMOS transistor; and the N-well, a drain, a source and a substrate of the PMOS transistor and a drain, a source, and a substrate of the varactor are all connected to a controllable power supply.

Further, at least one of the drain and the source of the varactor is N-type implanted and reused as a N-well tap of the PMOS transistor; and the PMOS transistor has no dedicated N-well tap, thus saving a shared area brought by a dedicated N-well tap.

Further, the source of the PMOS transistor is adjacent to the source of the varactor; the drain of the PMOS transistor is adjacent to the drain of the varactor; an active region of the PMOS transistor is adjacent to an active region of the varactor; and the gate of the PMOS transistor is adjacent to the gate of the varactor or the PMOS transistor and the varactor share one gate.

Further, the first NMOS transistor is an IO device or a high-voltage process device, and at least one of the PMOS and the varactor is a CORE device or a low-voltage process device.

Further, the controllable power supply comprises two states: a programmed high voltage and a normal operating voltage, wherein the normal operating voltage is a normal state of the controllable power supply and is used for reading data; and the programmed high voltage is only used in programming, and an OTP memory is usually programmed only once, so the programmed high voltage is usually used only once.

A data read-write circuit comprises the anti-fuse memory cell above, further comprising a second NMOS transistor, a reference signal and a comparator, wherein a gate of the second NMOS transistor is used for inputting a second selection signal, a drain of the second NMOS transistor is connected to the source of the first NMOS transistor, a source of the second NMOS transistor and the reference signal are connected to an input end of the comparator, and an output end of the comparator outputs a logic level.

An anti-fuse memory comprises a plurality of anti-fuse memory cells above, wherein the anti-fuse memory cells are connected in a matrix, and different anti-fuse memory cells are input with different first selection signals or different second selection signals.

Further, two adjacent anti-fuse memories connected to the same second selection signal at least share the source or the drain of one PMOS transistor and share the source or the drain of one varactor, so as to save chip area.

An operation method for the anti-fuse memory above comprises a data writing method, wherein the data writing method comprises:
  switching the controllable power supply to the programmed high voltage, taking the anti-fuse memory cell needing to write a value as a writing target cell, addressing the writing target cell, and setting a first selection signal and a second selection signal of the writing target cell to a high level; and setting at least one of the first selection signal and the second selection signal to be 0 V for anti-fuse memory cells that do not need to write values.

Further, the operation method for the anti-fuse memory comprises a data reading method, wherein the data reading method comprises:
  switching the controllable power supply to the normal operating voltage, wherein the normal operating voltage does not exceed 30% of the programmed high voltage, taking the anti-fuse memory cell needing to be read as a reading target cell, addressing the reading target cell, setting a first selection signal and a second selection signal of the reading target cell to a high level and outputting a logic level of 1 or 0 by the comparator.

Operating Principle:

The varactor in the present invention is equivalent to the special NMOS transistor placed in the N-well, which is completely separated and modeled in some processes, and is called a Varactor. It is found from a principle of a CMOS process, and the principle analysis of electronics and experiments that, this special device is also completely feasible in ordinary CMOS manufacturing processes without varactor models, and no extra mask or process flow is added.

During programming, the first NMOS is turned on, so that the gates of the PMOS transistor and the varactor are at 0 volt or a lower voltage, and the N-well is at a positive high voltage of a controllable power supply, which is equivalent to a negative high voltage acting on the gates of the PMOS transistor and the varactor at the same time, and a P inversion layer is formed in the N-well under the gates, and the P inversion layer has the same polarity with the source and the drain of the PMOS transistor, so that low-resistance conduction may be realized, which is beneficial for reliable gate breakdown and low-resistance connection.

When a reading operation is carried out during operation, the first NMOS is turned on, but because the controllable power supply of the N-well is at a normal operating voltage, which is relatively low, a voltage difference between the gates that have been broken down and formed resistive connection and the N-well is small, so that the P inversion or an incomplete inversion is no longer formed. An original N-type layer under the gate herein has the same polarity with the source and the drain of the varactor, and if there is the P inversion under the gate, the P inversion layer will have the same polarity with the source and the drain of the PMOS, and in either case, the present invention can provide reliable low-resistance conduction by means of the source and the drain with two polarities, thus improving a chip yield, increasing a reading speed and greatly simplifying a design of a comparator.

On the other hand, due to a rule that the N-well has a minimum width, even if the PMOS transistor and the varactor are adjacent to each other increasing a width of the active region, the width still does not exceed a width of the active region capable of being contained by the N-well under the minimum width rule, which means that an area of the N-well is not increased.

According to the present invention, the varactor, which is namely the special NMOS, is adjacent to the PMOS, which not only increases a gate area of the programmable memory cell, but also is used as N-well tap of the PMOS transistor, thus saving the overall area and reducing the on-resistance after programming.

The present invention provides the anti-fuse memory cell and the data read-write circuit thereof, which, compared with the prior art, have the following beneficial effects.

1. The PMOS transistor is adjacent to the varactor to jointly serve as the programmable region of the memory cell, which is equivalent to providing twice a gate oxide area, thus being beneficial for reliable breakdown by a high voltage when necessary.
2. The source and the drain of the varactor are also used as N-well tap, and an N-well tap point is close to the programmable region, thus reducing on-resistance after high-voltage breakdown, improving reliability and simplifying the design of the comparator, and the low-resistance conduction and the simplified comparator design are beneficial for increasing the data reading speed.
3. The PMOS transistor and the varactor share one N-well region, which improves a performance without increasing a unit area, and an area of dedicated N-well tap reserved for the PMOS transistor in a conventional design is saved at the same time.
4. Compared with a conventional anti-fuse design in which the gate is connected to a programmed high voltage and a withstand voltage of the gate should be considered, the N-well is used as an input of the programmed high voltage in the present invention, which gives full play to a characteristic that a withstand voltage of the N-well is much higher than that of the gate, thus reducing a design difficulty of a high-voltage circuit.
5. Compared with the conventional anti-fuse design having disadvantages that the N-well is connected to the drain of the first NMOS transistor and a parasitic capacitance of the N-well to the substrate is large, the N-well is used as a controllable power supply terminal in the present invention, which is at a static voltage in normal operation, and the disadvantage that the parasitic capacitance of the N-well is large does not affect the reading speed at all.
6. The present invention only adopts a CORE low-voltage device and an TO high-voltage device which are standard devices of a CMOS process, and is compatible with existing conventional semiconductor manufacturing processes, without adding any additional masks, thus being easy to manufacture, high in yield and low in comprehensive cost.

DETAILED DESCRIPTION

The present invention is further explained and described hereinafter with reference to the drawings and specific embodiments.

First Embodiment

Figure 1:
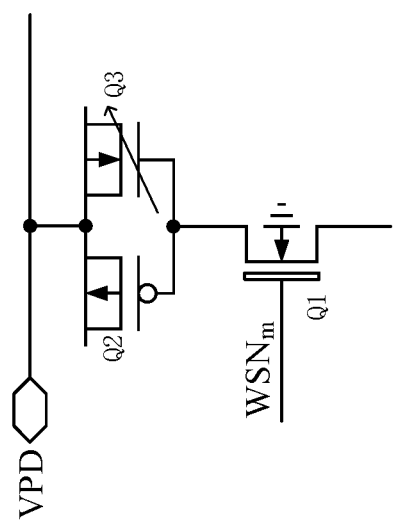
FIG. 1 is a schematic diagram of a circuit of an anti-fuse memory cell.

As shown in FIG. 1, an anti-fuse memory cell comprises a first NMOS transistor Q1, a PMOS transistor Q2 and a varactor Q3, wherein an N-well, a drain, a source and a substrate of the PMOS transistor, and a drain, a source and a substrate of the varactor are all connected to a controllable power supply VPD. A gate of the PMOS transistor and a gate of the varactor are connected to a drain of the first NMOS transistor, and a gate of the first NMOS transistor inputs a first selection signal WSNm. The first NMOS transistor Q1 is an IO device or a high-voltage process device of 2.5 V to 5 V, such as 2.5 V/3.3 V/5 V, and may withstand a higher programming voltage during occasional programming for a short time, and the PMOS transistor and the varactor are a CORE device or a low-voltage process device of 0.7 V to 1.8 V, such as 0.9 V/1.0 V/1.2 V/1.5 V/1.8 V.

Figure 4:
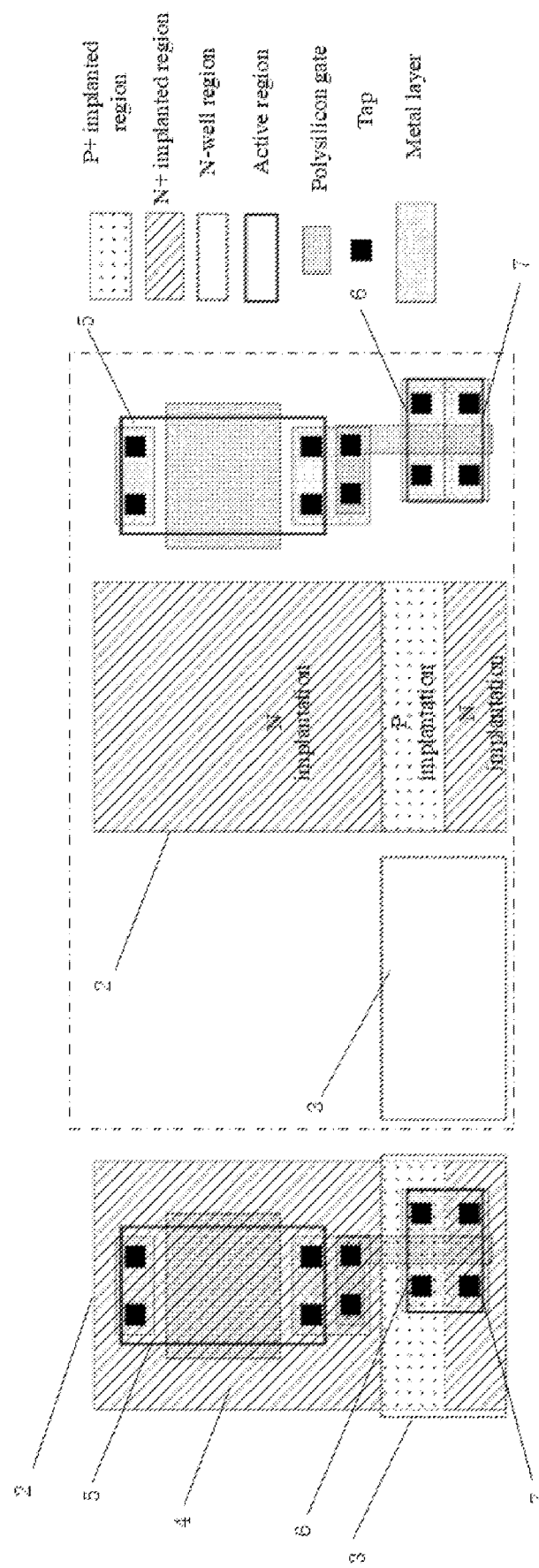
FIG. 4 is a layout diagram of the anti-fuse memory cell.

It can be seen from the layout diagram as shown in FIG. 4 that, for the convenience of viewing, an exploded view of the layout diagram on the left is shown in a dashed box on the right. The anti-fuse memory cell comprises a base 2, wherein the base 2 is provided with an N-well region 3 and a non-N-well region 4. The non-N-well region 4 is provided with a first NMOS transistor 5, and a gate of the first NMOS transistor 5 is used for inputting a first selection signal. The N-well region 3 is provided with a PMOS transistor 6 and a varactor 7, and a gate of the PMOS transistor 6 and a gate of the capacitor transistor 7 are both connected to a drain of the first NMOS transistor 5. A drain, a source and a substrate of the PMOS transistor 6 and a drain, a source, and a substrate of the varactor 7 are all connected to a controllable power supply.

Figure 5:
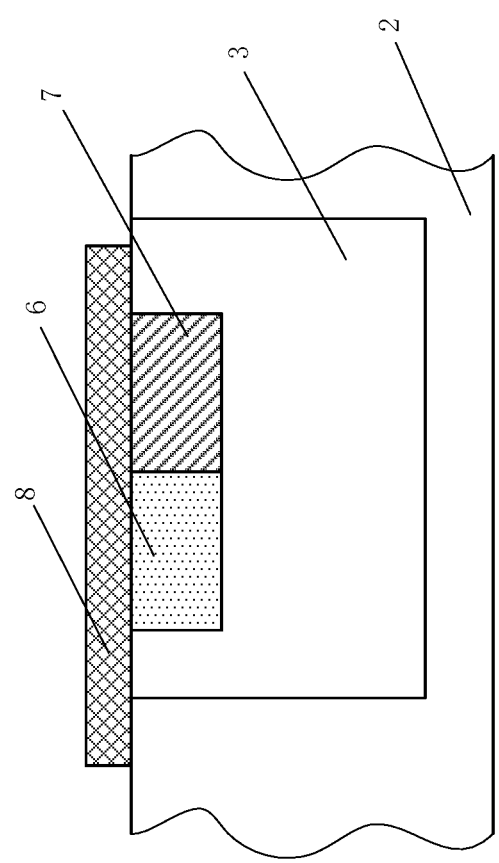
FIG. 5 is a cross-sectional view of a PMOS transistor and a varactor in FIG. 4 along a line A-A'.

As shown in FIG. 5, the PMOS transistor 6 and the varactor 7 are in one N-well region together. A channel of the varactor 7 is formed by the N-well, and the source and the drain of the varactor are an N+ implanted layer in connection with the N-well, and are connected to the power supply, so that the drain and/or the source of the varactor 7 may be reused as a N-well tap of the PMOS transistor 6. The PMOS transistor 6 has no dedicated N-well tap. In this way, an area can be reduced, so that an arrangement density of the anti-fuse memory cell is higher. In addition, the PMOS transistor 6 and the varactor 7 may be abutted together, for example, the source of the PMOS transistor 6 is butted with the source of the varactor 7, the drain of the PMOS transistor 6 is abutted with the drain of the varactor 7, and the gate of the PMOS transistor is abutted with the gate of the varactor or the PMOS transistor and the varactor may be said to share one gate 8, thus further reducing the area.

The drain of the first NMOS transistor is placed close to the gate of at least one of the PMOS transistor and the varactor, thus further reducing the area and improving an arrangement density of the device.

The controllable power supply VPD comprises a programmed high voltage and a normal operating voltage, wherein the high voltage is 4 V to 7 V, such as 5 V; and the normal operating voltage is a relatively low voltage of 0.7 V to 1.8 V, such as 1.2 V. Other values may also be selected according to different environments. During data writing, the VPD inputs the high voltage; and during data reading, the VPD inputs the low voltage.

Figure 2:
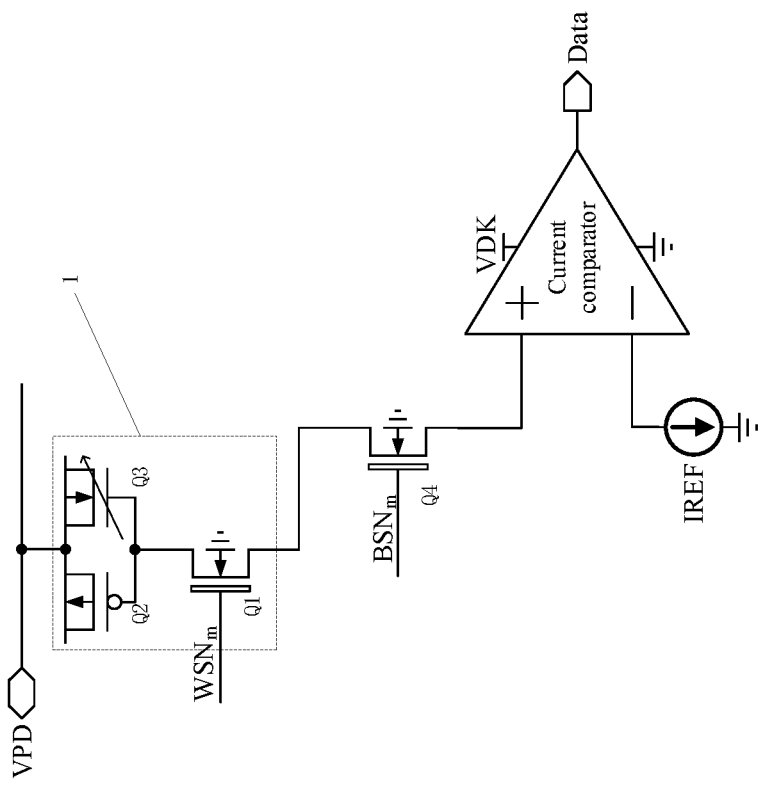
FIG. 2 is a schematic diagram of a data read-write circuit of the anti-fuse memory cell.
Figure 3:
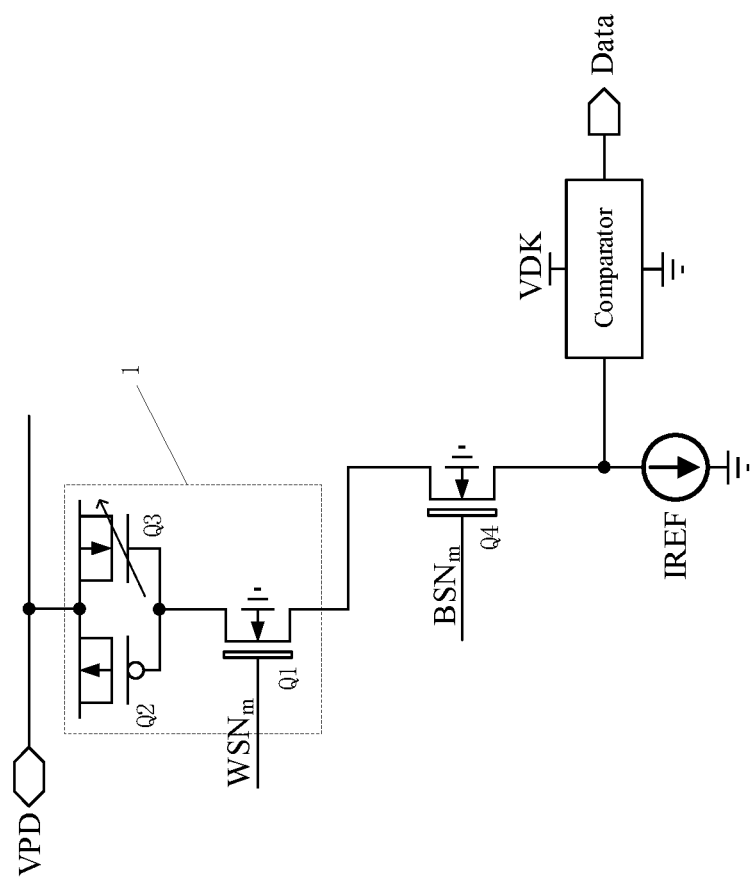
FIG. 3 shows another implementation mode of the data read-write circuit of the anti-fuse memory cell.

FIG. 2 shows a data read-write circuit of the anti-fuse memory cell, and the data read-write circuit comprises the anti-fuse memory cell 1 above, a second NMOS transistor Q4, a reference current source IREF and a comparator, wherein a gate of the second NMOS transistor is used for inputting a second selection signal, a drain of the second NMOS transistor is connected to the source of the first NMOS transistor, a source of the second NMOS transistor is connected to a first input end of the comparator, a second input end of the comparator is connected to the reference current source IREF, and an output end of the comparator outputs a logic level. In addition, a voltage comparator may also be used, and a reference voltage source is used accordingly. The implementation mode may also be as shown in FIG. 3, and the source of the second NMOS transistor is connected to the reference current source and the comparator.

Figure 6:
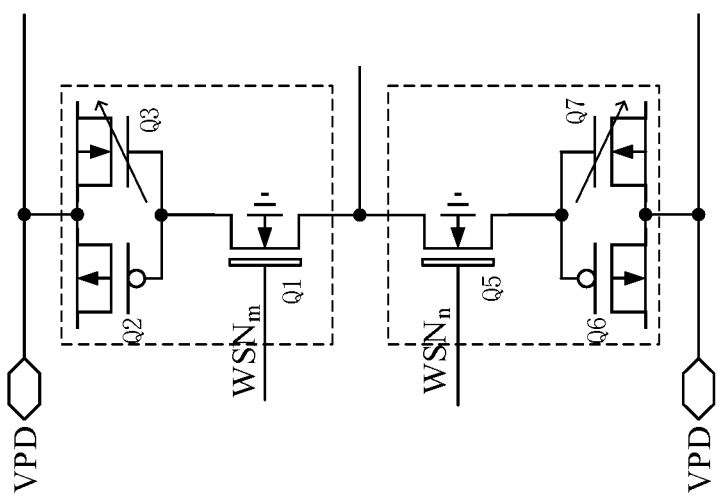
FIG. 6 is a schematic diagram of a circuit of a 2-bit anti-fuse memory cell.
Figure 7:
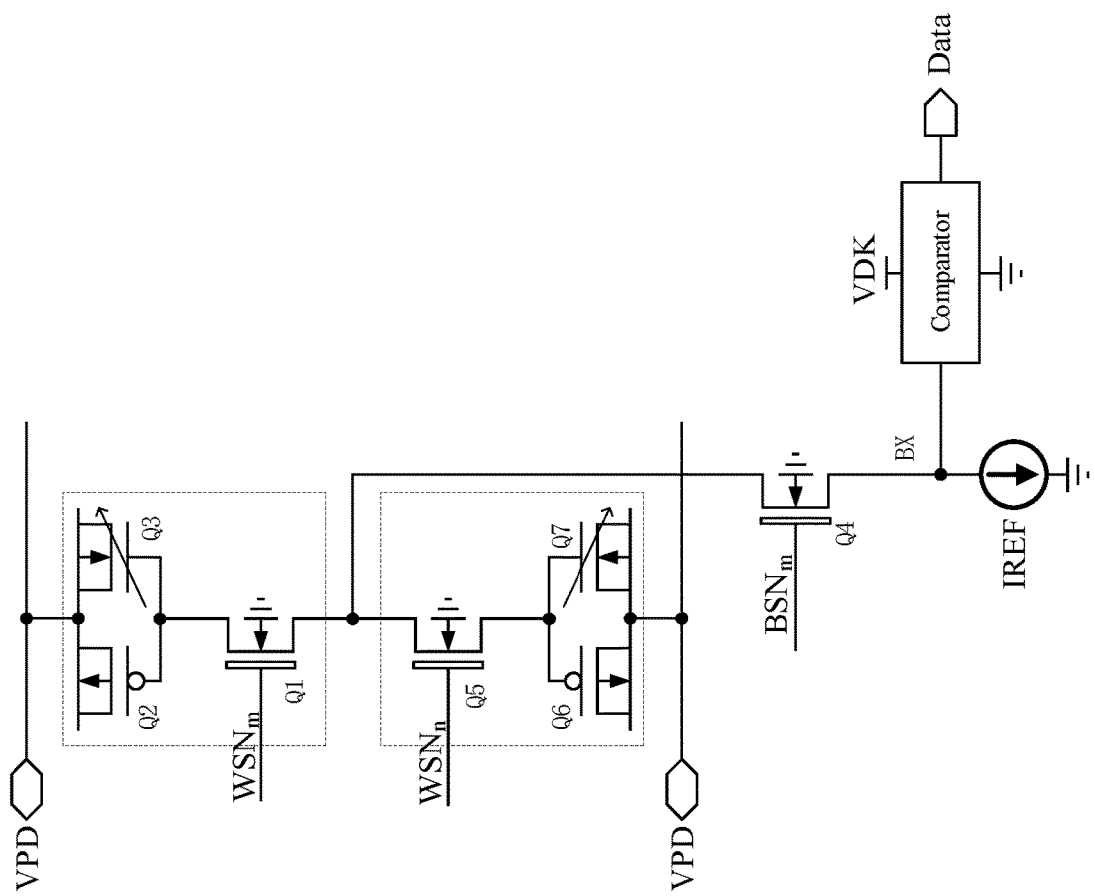
FIG. 7 is a schematic diagram of a data read-write circuit of the 2-bit anti-fuse memory cell.
Figure 8:
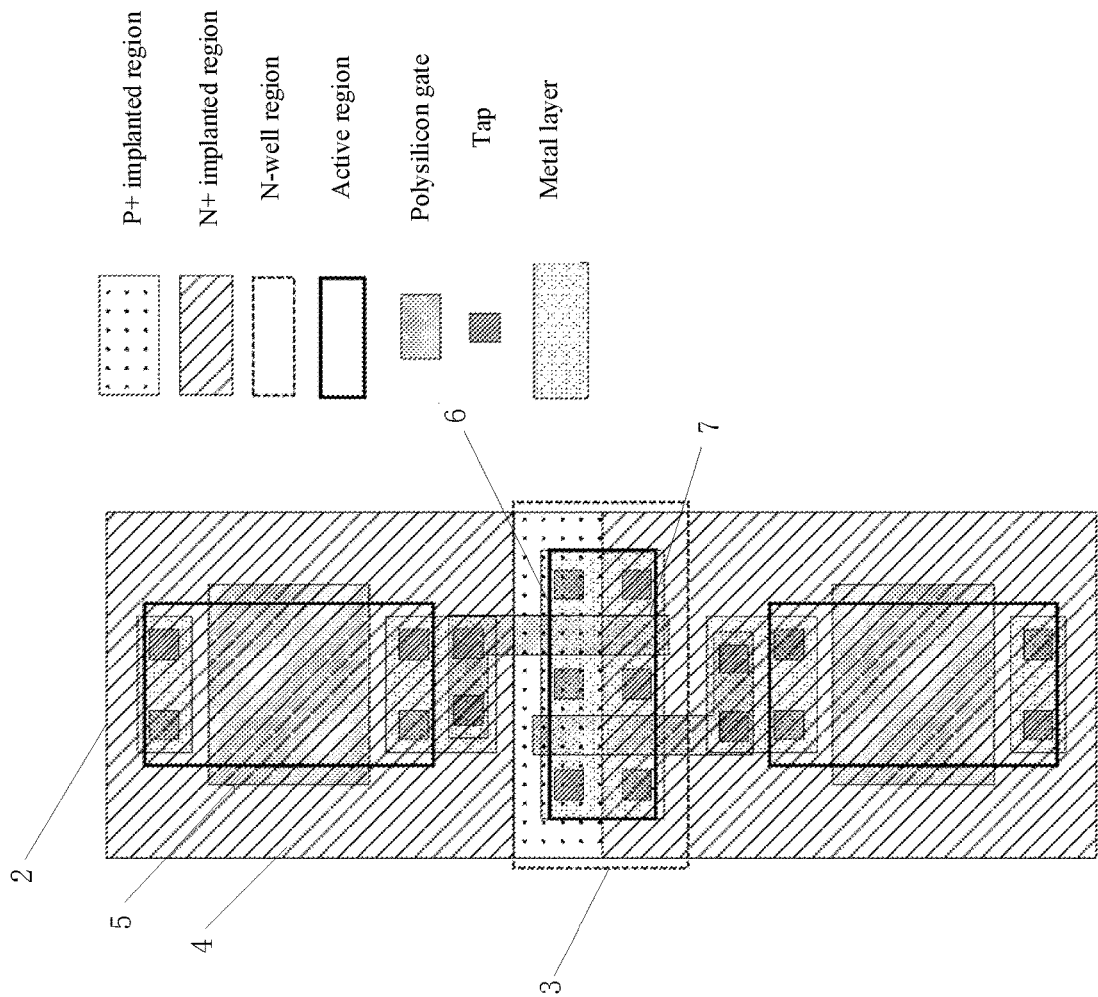
FIG. 8 is a layout diagram of the 2-bit anti-fuse memory cell.
Figure 9:
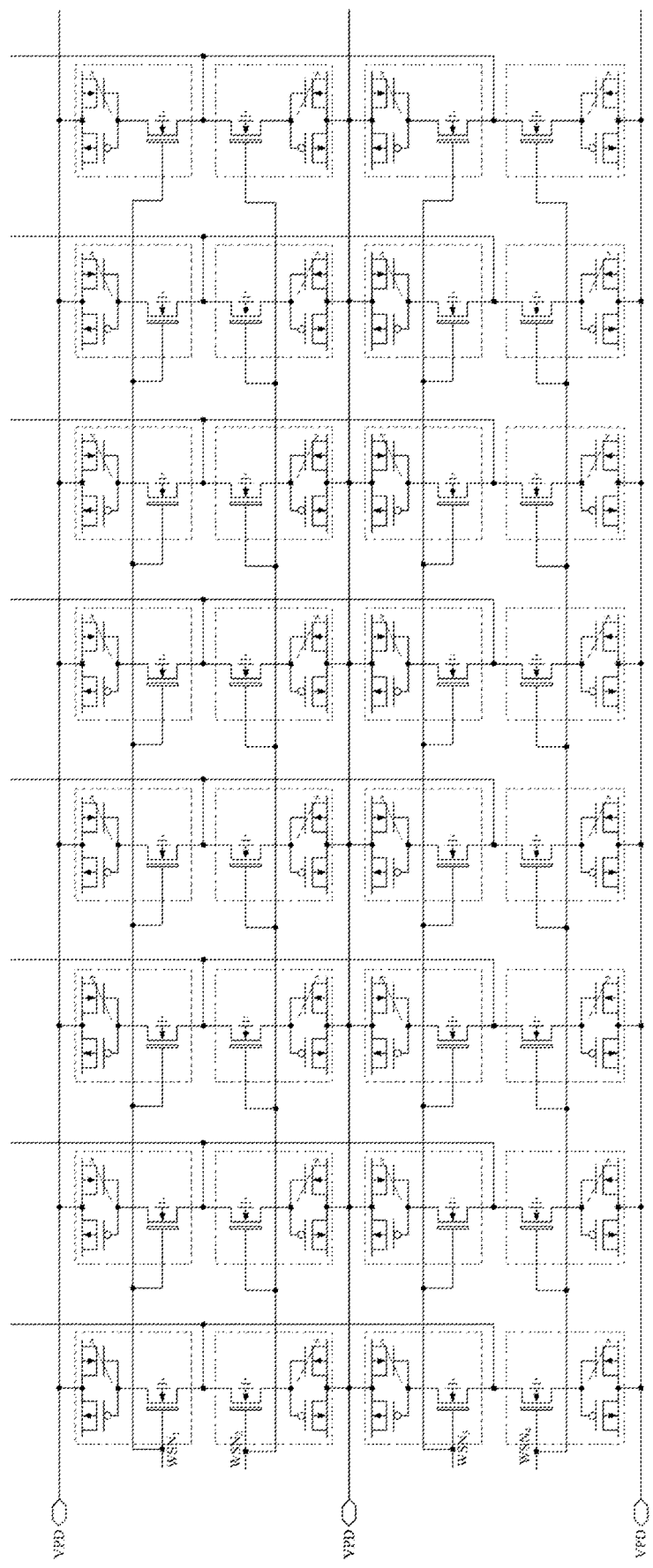
FIG. 9 is a schematic diagram of a circuit of an array of an 8×4 bits anti-fuse memory cell.
Figure 10:
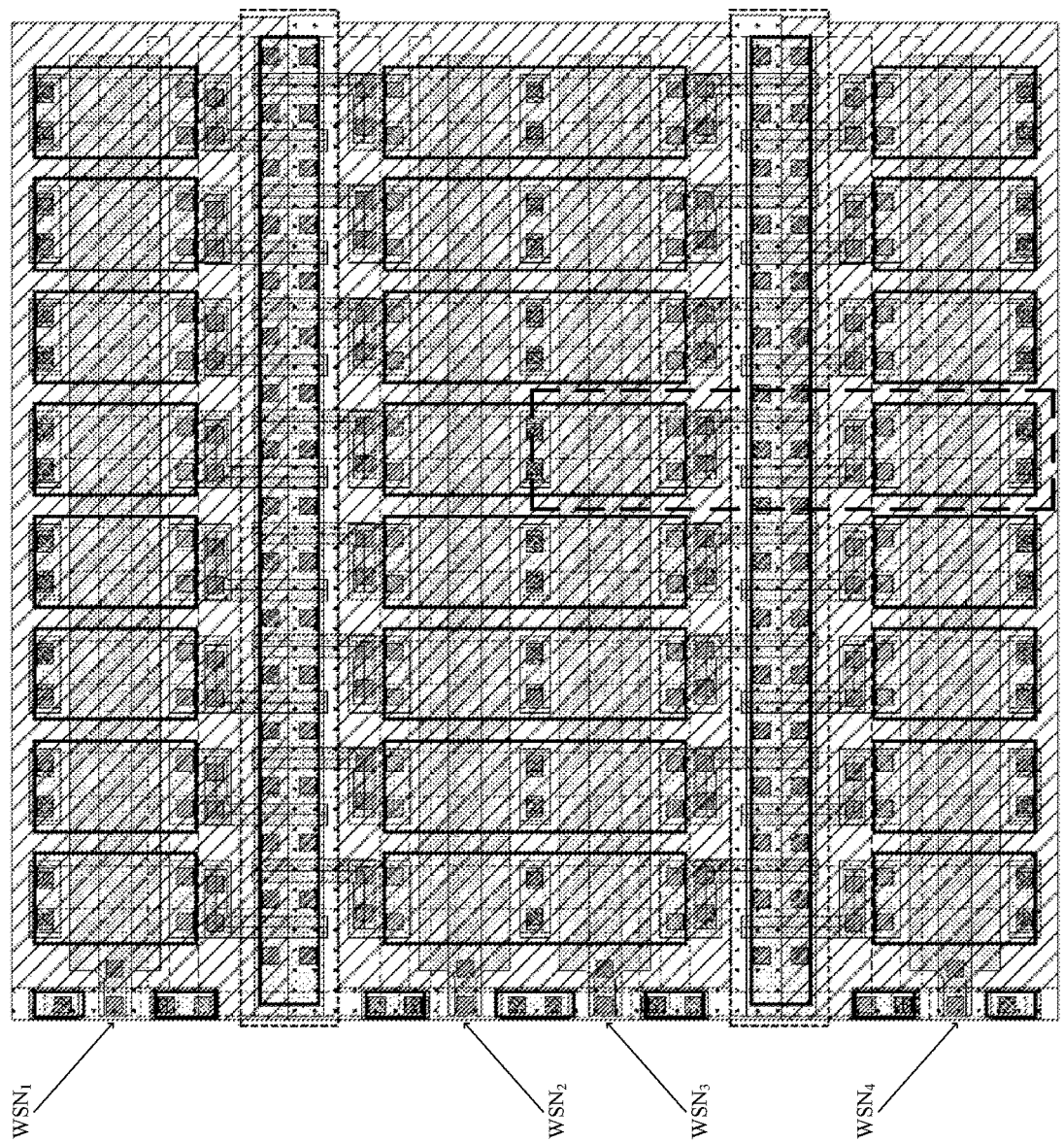
FIG. 10 is a layout diagram of the array of the 8×4 bits anti-fuse memory cell.

The anti-fuse memory comprises a plurality of anti-fuse memory cells, wherein the anti-fuse memory cells are connected in a matrix, and as shown in FIG. 9, different anti-fuse memory cells are input with different first selection signals WSN or different second selection signals BSN (the read-write circuit part is not drawn). The memory cell needing to write a value is selected through the first selection signal WSN and the second selection signal BSN. FIG. 10 is a layout diagram of an array of the matrix. FIG. 6 is a diagram of a circuit of a 2-bit anti-fuse memory cell, and FIG. 7 is a diagram of a read-write circuit of the 2-bit anti-fuse memory cell. Two cells have first selection signals WSNm and WSNn respectively, and share a second selection signal BSNm. In order to further reduce the area and increase the arrangement density as much as possible, as shown in FIG. 8, two adjacent anti-fuse memories connected to the same second selection signal may share the source or the drain of one PMOS transistor, share the source or the drain of one varactor, and share one N-well region 3.

An operation method for the anti-fuse memory comprises a data writing method and a data reading method, which are specifically as follows:

(1) During data writing, the controllable power supply inputs a high voltage of 4 V to 7 V, such as 5 V, and the source, the drain, and the substrate of the PMOS transistor and the source, the drain and the substrate of the varactor are all pulled to a high-voltage potential.

The anti-fuse memory cell needing to write an effective value is taken as a writing target cell, and as shown in FIG. 7, a first selection signal WSNm and a second selection signal BSNm corresponding to the writing target cell are both set to a high level, such as 3.3 V, according to position addressing of the writing target cell, so that the first NMOS transistor Q1 and the second NMOS transistor Q4 are turned on. For the writing target cell needing to write the logic 1, the gate of the PMOS transistor and the gate of the capacitor transistor are pulled to 0 V. In normal operating mode, voltages at two ends of a gate capacitor of the PMOS transistor generally do not exceed 2 V, but at this moment a voltage difference between the two ends can reach 5 V. The high voltage causes breakdown between the gate and source/drain/substrate inside the PMOS transistor or the varactor, so that the memory cell forms resistive connection and forms a conductive path between the gate and source/drain/substrate, which is equivalent to an on-resistance. Then the writing operation is completed.

For the anti-fuse memory cell that does not need to write the effective value or an ineffective value is written, at least one of the first selection signal WSNm and the second selection signal BSNm of the memory cell is set to be 0 V, so that at least one of the first NMOS transistor Q1 and the second NMOS transistor Q4 of the memory cell is not turned on, and the memory cell is kept in an insulated state. There is not sufficient voltage difference between the gate and the N-well in both the PMOS transistor and the varactor, so that there is no breakdown between the gate and the N-well, thus avoiding forming a conductive path.

(2) During data reading, the controllable power supply is switched to the relatively low normal operating voltage, wherein the low voltage does not exceed 30% of the programmed high voltage, such as 1.2 V, and the source, the drain and the substrate of the PMOS transistor and the source, the drain and the substrate of the varactor are pulled to a low-voltage power supply potential VDDK of 1.2 V. The memory cell needing to be read is taken as a reading target cell, a first selection signal and a second selection signal of the reading target cell are both set to a high level, such as 3.3 V or 1.8 V, and the first NMOS transistor and the second NMOS transistor are turned on.

For the memory cell that a logic 1 is written, because the bit is written by the programmed high voltage before, the gate capacitor of the PMOS transistor is broken down, so that the memory cell is in a resistive connection state At the moment, VPD=1.2 V, which is output to the input end of the comparator through on-resistance. Taking FIG. 3 as an example, because a current value of the IREF is in an order of several uA to tens of uA, an input of the comparator is pulled up to 1.2 V. Therefore, an output of the comparator is logically high.

For the cell which bit value remains logic 0, because the bit is not written by the programmed high voltage before, the gate capacitor of at least one of the PMOS transistor and the varactor is not broken down, so that there is no resistive path, and the memory cell is in an insulated state. Taking FIG. 3 as an example, at the moment, VPD=1.2 V, basically no current will reach an input end of the comparator through the PMOS transistor or the varactor. The IREF pulls down the input of the comparator to 0 V. Therefore, the output of the comparator is logically low.

Second Embodiment

The only difference between Second Embodiment and First Embodiment lies in that, in the read-write circuit of the anti-fuse memory cell, a BX point of the source of the second NMOS transistor is also connected with a pull-up transistor and a pull-down transistor. During data writing, for the memory cell needing to write the logic 1, the BX point is pulled down to a low potential of 0 V except that the first selection signal WSNm and the second selection signal BSNm of the writing target cell are both set to a high level; and for the memory cell that does not need to write the effectively values or the logic 0 is written, the BX point is pulled up to a high potential, such as 4.3 V (VPD-0.7 V). The rest is the same as First Embodiment.

What is claimed is:

1. An anti-fuse memory cell, comprising a base, wherein the base is provided with an N-well and a non-N-well region; the non-N-well region is provided with a first NMOS transistor; a gate of the first NMOS transistor is used for inputting a first selection signal; the N-well is provided with a PMOS transistor and a varactor; a gate of the PMOS transistor and a gate of the varactor are both connected to a drain of the first NMOS transistor; and the N-well, a drain, a source and a substrate of the PMOS transistor and a drain a source, and a substrate of the varactor are all connected to a controllable power supply; the source of the PMOS transistor is adjacent to the source of the varactor; the drain of the PMOS transistor is adjacent to the drain of the varactor; an active region of the PMOS transistor is adjacent to an active region of the varactor; the gate of the PMOS transistor is adjacent to the gate of the varactor or the PMOS transistor and the varactor share one gate, and at least one of the drain and the source of the varactor is N-type implanted and reused as a N-well tap of the PMOS transistor; and the PMOS transistor has no dedicated N-well tap.

2. The anti-fuse memory cell according to claim 1, wherein the first NMOS transistor is an IO device or a high-voltage process device, and at least one of the PMOS and the varactor is a CORE device or a low-voltage process device.

3. The anti-fuse memory cell according to claim 1, wherein the controllable power supply comprises a programmed high voltage and a normal operating voltage.

4. A data read-write circuit comprising the anti-fuse memory cell according to claim 1 or 2, further comprising a second NMOS transistor, a reference signal and a comparator, wherein a gate of the second NMOS transistor is used for inputting a second selection signal, a drain of the second NMOS transistor is connected to the source of the first NMOS transistor, a source of the second NMOS transistor and the reference signal are connected to an input end of the comparator, and an output end of the comparator outputs a logic level.

5. An anti-fuse memory, comprising a plurality of anti-fuse memory cells according to claim 1, wherein the anti-fuse memory cells are connected in a matrix, and different anti-fuse memory cells are input with different first selection signals or different second selection signals.

6. The anti-fuse memory according to claim 5, wherein two adjacent anti-fuse memories connected to the same second selection signal at least share the source or the drain of one PMOS transistor and share the source or the drain of one varactor.

7. An operation method for the anti-fuse memory according to claim 5, comprising a data writing method, wherein the data writing method comprises:
    switching the controllable power supply to the programmed high voltage, taking the anti-fuse memory cell needing to write a value as a writing target cell, addressing the writing target cell, and setting both a first selection signal and a second selection signal of the writing target cell to a high level; and on the other hand, setting at least one of the first selection signal and the second selection signal to be 0 V for anti-fuse memory cells that do not need to write values.

8. The operation method for the anti-fuse memory according to claim 7, comprising a data reading method, wherein the data reading method comprises:
    switching the controllable power supply to the normal operating voltage, wherein the normal operating voltage does not exceed 30% of the programmed high voltage, taking the anti-fuse memory cell needing to be read as a reading target cell, addressing the reading target cell, setting a first selection signal and a second selection signal of the reading target cell to a high level, and outputting a logic level of 1 or 0 by the comparator.

* * * * *